US011588302B2

(12) United States Patent
Gubbins et al.

(10) Patent No.: US 11,588,302 B2
(45) Date of Patent: Feb. 21, 2023

(54) OPTICAL SWITCHES

(71) Applicant: Seagate Technology LLC, Cupertino, CA (US)

(72) Inventors: Mark A. Gubbins, Letterkenny (IE); Marcus B. Mooney, Burnfoot (IE); Aidan D. Goggin, Redcastle (IE); Paula F. McElhinney, Londonderry (GB); Debra A. McNeill, Londonderry (GB); Fadi El Hallak, Londonderry (GB); Brendan Lafferty, Muff (IE)

(73) Assignee: Seagate Technology LLC, Fremont, CA (US)

( * ) Notice: Subject to any disclaimer, the term of this patent is extended or adjusted under 35 U.S.C. 154(b) by 823 days.

(21) Appl. No.: 16/449,302

(22) Filed: Jun. 21, 2019

(65) Prior Publication Data
US 2020/0403384 A1    Dec. 24, 2020

(51) Int. Cl.
*H04Q 11/00* (2006.01)
*H01S 5/02325* (2021.01)
*H01S 5/50* (2006.01)
*H01S 5/024* (2006.01)
*H01S 5/30* (2006.01)

(52) U.S. Cl.
CPC ........ *H01S 5/5027* (2013.01); *H01S 5/02325* (2021.01); *H01S 5/02469* (2013.01); *H01S 5/3013* (2013.01); *H04Q 11/0003* (2013.01); *H04Q 11/0005* (2013.01); *H04Q 2011/0013* (2013.01); *H04Q 2011/0041* (2013.01)

(58) Field of Classification Search
None
See application file for complete search history.

(56) References Cited

U.S. PATENT DOCUMENTS

| | | | |
|---|---|---|---|
| 4,013,000 A | 3/1977 | Kogelnik | |
| 4,378,144 A | 3/1983 | Duck et al. | |
| 4,415,229 A | 11/1983 | McCullough | |
| 5,115,481 A | 5/1992 | Buhrer | |
| 5,729,642 A | 3/1998 | Thaniyavarn | |
| 5,835,458 A | 11/1998 | Bischel et al. | |
| 5,859,939 A * | 1/1999 | Fee .................... | H04B 10/2569 385/24 |
| 6,144,449 A | 11/2000 | Knuettel et al. | |

(Continued)

FOREIGN PATENT DOCUMENTS

EP 1354381 10/2003
WO 2018/053527 3/2018

OTHER PUBLICATIONS

Stabile: "Towards Large-Scale Fast Reprogrammable SOA-Based Photonic Integrated Switch Circuits", Applied Sciences, 2017, 7, 920 (Year: 2017).*

(Continued)

*Primary Examiner* — Li Liu
(74) *Attorney, Agent, or Firm* — Mueting Raasch Group

(57) ABSTRACT

Exemplary methods and apparatus may provide optical gates and optical switches using such optical gates. Each optical gate may include a semiconductor optical amplifier that is placed in a substrate. The semiconductor optical amplifier may be coupled to input and output couplers to receive and selectively output optical signals into and out of the substrate.

19 Claims, 6 Drawing Sheets

(56) References Cited

U.S. PATENT DOCUMENTS

| | | | | |
|---|---|---|---|---|
| 6,243,178 | B1* | 6/2001 | Suemura | H04Q 11/0005 398/56 |
| 6,335,993 | B1 | 1/2002 | Takahashi | |
| 6,344,913 | B1* | 2/2002 | Manning | G02F 1/3517 359/347 |
| 6,347,106 | B1 | 2/2002 | Dijaili et al. | |
| 6,404,943 | B1 | 6/2002 | Wang | |
| 6,490,383 | B1* | 12/2002 | Jourdan | H04Q 11/0005 385/24 |
| 6,526,194 | B1 | 2/2003 | Laor | |
| 6,571,035 | B1 | 5/2003 | Pi et al. | |
| 6,665,495 | B1* | 12/2003 | Miles | H04Q 11/0005 370/352 |
| 6,747,793 | B1 | 6/2004 | Flanders | |
| 6,807,213 | B1* | 10/2004 | Shimoyama | H01S 5/2231 372/49.01 |
| 6,882,429 | B1 | 4/2005 | Weitekamp et al. | |
| 6,975,664 | B1 | 12/2005 | Dodabalapur et al. | |
| 6,985,648 | B2 | 1/2006 | Kish, Jr. et al. | |
| 7,426,210 | B1* | 9/2008 | Miles | H04J 14/0223 370/429 |
| 7,787,719 | B1* | 8/2010 | Vawter | H03K 3/42 385/24 |
| 7,876,981 | B2 | 1/2011 | Dames | |
| 8,501,536 | B2 | 8/2013 | Mooney et al. | |
| 8,578,555 | B2 | 11/2013 | Conrad | |
| 8,582,931 | B1* | 11/2013 | Vawter | G02F 1/3133 385/24 |
| 8,675,199 | B2 | 3/2014 | Duer | |
| 8,753,974 | B2 | 6/2014 | Griffin et al. | |
| 8,988,754 | B2 | 3/2015 | Sun et al. | |
| 9,685,762 | B1* | 6/2017 | Norberg | H01S 5/5027 |
| 10,928,659 | B2* | 2/2021 | Rickman | H04B 10/299 |
| 2002/0076133 | A1 | 6/2002 | Li et al. | |
| 2004/0004217 | A1 | 1/2004 | Jayaraman | |
| 2004/0071160 | A1* | 4/2004 | Park | H04Q 11/0005 370/465 |
| 2007/0223921 | A1* | 9/2007 | Sone | H04Q 11/0066 398/45 |
| 2009/0003827 | A1* | 1/2009 | Kai | H04J 14/0227 398/45 |
| 2009/0169205 | A1* | 7/2009 | Bergman | H04Q 11/0005 398/45 |
| 2010/0080504 | A1* | 4/2010 | Shetrit | G02F 1/2257 385/14 |
| 2010/0254705 | A1* | 10/2010 | Perkins | H04J 14/0204 398/48 |
| 2011/0164310 | A1* | 7/2011 | Tanaka | H01S 5/0612 359/344 |
| 2014/0131860 | A1* | 5/2014 | Kanda | H01L 23/4824 257/737 |
| 2014/0334769 | A1* | 11/2014 | Nakamura | G02F 1/3136 385/14 |
| 2015/0277157 | A1* | 10/2015 | Jones | G02B 6/4295 385/2 |
| 2016/0334575 | A1* | 11/2016 | Graves | H04Q 3/526 |
| 2021/0028534 | A1* | 1/2021 | Liu | H01L 25/18 |

OTHER PUBLICATIONS

Groote et al: "Transfer-printing-based integration of single-mode waveguide-coupled III-V-on-silicon broadband light emitters", Optical Express, vol. 24, No. 13, Jun. 13, 2016, pp. 1-9 (Year: 2016).*
Corbett et al: "Transfer-printing for heterogeneous integration", OFC 2019, Mar. 3-7, 2019, paper No. M2D.1, pp. 1-3 (Year: 2019).*
Liang: Integrated HAMR Light Delivery System via High Q Resonators, Thesis for Doctor of Philosophy, Aug. 2018 (Year: 2018).*
Armstrong et al., "Semiconductor optical amplifiers: Performance and applications in optical packet switching", Dec. 2004, Journal of Optical Networking, 3(12):882-897.
Barwicz et al., "Automated, self-aligned assembly of 12 fibers per nanophotonic chip with standard microelectronics assembly tooling", 2015 IEEE 65th Electronic Components and Technology Conference, ECTC 2015, Jul. 15, 2015, pp. 775-782.
Barwicz et al., "Low-Cost Interfacing of Fibers to Nanophotonic Waveguides: Design for Fabrication and Assembly Tolerances", IEEE Photonics Journal, vol. 6, No. 4, Aug. 2014, 19 pages.
Cheng et al., "Photonic switching in high performance datacenters", Optics Express 16022, Jun. 11, 2018, vol. 26, No. 12, 22 pages.
Corbett et al., "Transfer print techniques for heterogenous integration of photonic components", 2017, Progress in Quantum Electronics, vol. 52, 17 pages. Available online Feb. 3, 2017.
Corbett et al., "Strategies for integration of laser on silicon", Aug. 21, 2013, Semicond. Scr. Technol. 28:094001, 6 pages.
Justice et al., "Wafer-scale integration of group III-V lasers on silicon using transfer printing of epitaxial layers", Sep. 2012, Nat. Photon., 6:610-614. Published online Aug. 19, 2012.
Ma et al., "Ultralow loss single layer submicron silicon waveguide crossing for SOI optical interconnect", Dec. 2, 2013, Opt. Express, 21(24):29374-29382. Published Nov. 20, 2013.
Mekis et al., "Advanced Silicon Photonics Transceivers", 2017 European Conference on Optical Communication, Sep. 17-21, 2017.
Mellette et al., "A Scalable, Partially Configurable Optical Switch for Data Center Networks", Jan. 15, 2017, Journal of Lightwave Technology, 35(2):136-144. Date of publication: Dec. 4, 2016.
Mellette et al., "RotorNet: A Scalable, Low-complexity Optical Datacenter Network", In Proceedings of SIGCOMM 17, SIGCOMM '17, Aug. 21-25, 2017, Los Angeles, California, 14 pages.
Stabile et al., Chapter 10, "Photonic Integrated Semiconductor Optical Amplifier Switch Circuits", Advances in Optical Amplifiers, Prof. Paul Urquhart (Ed.), ISBN: 978-953-307-186-2, InTech, pp. 205-230 plus publishing Information page. Available online from: http://www.intechopen.com/books/advances-in-optical-amplifiers/photonic-integrated-semiconductor-opticalamplifier-switch-circuits.
Stabile et al., "Integrated optical switch matrices for packet data networks", 2016, Microsystems & Nanoengineering, 2:15042. 10 pages. Published online Jan. 11, 2016.
Stubkjaer et al., "Recent Advances in Semiconductor Optical Amplifiers and Their Applications", 1992, Fourth International Conference on Indium Phosphide and Related Materials, pp. 242-245.
Zhang et al., "Transfer-printing-based integration of III-V-on-silicon distributed feedback laser", Optics Express, vol. 36, No. 7, Apr. 2, 2018, 10 pages.

* cited by examiner

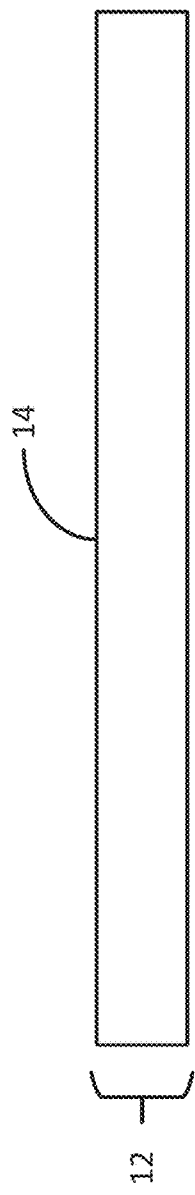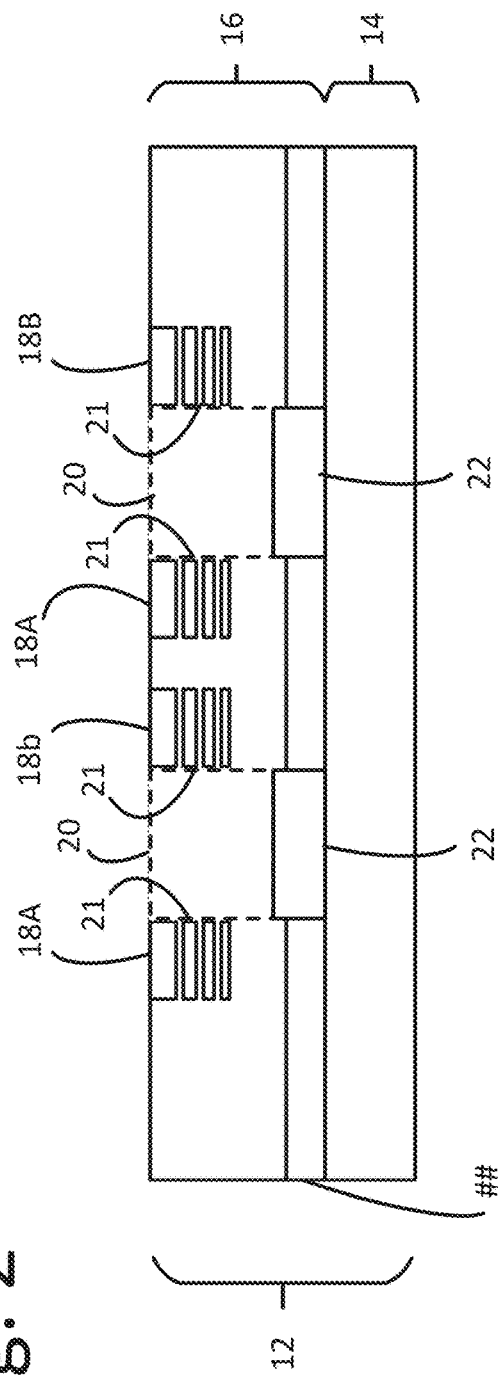

OPTICAL SWITCHES

The disclosure herein relates to optical switches, e.g., integrated optical switches, and method of making such optical switches.

SUMMARY

An illustrative method may include providing a substrate including a base layer and a device layer on the base layer. The method may also include forming input and output optical couplers in the device layer, the optical couplers to transmit light into and out of the device layer. Further, the method may include defining a cavity in the device layer. Still further, the method may include providing a semiconductor optical amplifier including an optical amplifier input to receive and optical signal and an optical amplifier output to selectively output the received optical signals. Finally, the method may include placing the semiconductor optical amplifier in the cavity, optically coupling the optical amplifier input to the input optical coupler and the optical amplifier output to the output optical coupler.

An illustrative apparatus may include a substrate, a plurality of inputs, a plurality of outputs, and a plurality of semiconductor optical amplifiers. The plurality of inputs may receive optical signals and may be positioned on the substrate. The plurality of outputs may output the optical signals may be positioned on the substrate. The plurality of semiconductor optical amplifiers may be mechanically placed in the substrate to optically couple the plurality of inputs and the plurality of outputs to provide a switch arranged between the plurality of inputs and the plurality of outputs. The plurality of semiconductor optical amplifiers may be operable to act as gates for the optical signals between the plurality of inputs and the plurality of outputs.

An illustrative optical gate may include a substrate, input and output optical couplers, and a semiconductor optical amplifier. The substrate may include a base layer and a device layer on the base layer. The input and output optical couplers may be formed in the device layer and may transmit light into and out of the device layer. The semiconductor optical amplifier may be mechanically placed in the device layer. The semiconductor optical amplifier may include an optical amplifier input optically coupled to the input optical coupler to receive an optical signal and an optical amplifier output optically coupled to the output optical coupler to selectively output the received optical signal.

BRIEF DESCRIPTION OF THE DRAWINGS

The disclosure may be more completely understood in consideration of the following detailed description of various embodiments of the disclosure in connection with the accompanying drawings.

FIGS. 1-7 are cross-sectional diagrams of an integrated optical switch throughout various stages of an integrated optical switch build process.

DETAILED DESCRIPTION

Figure 3:
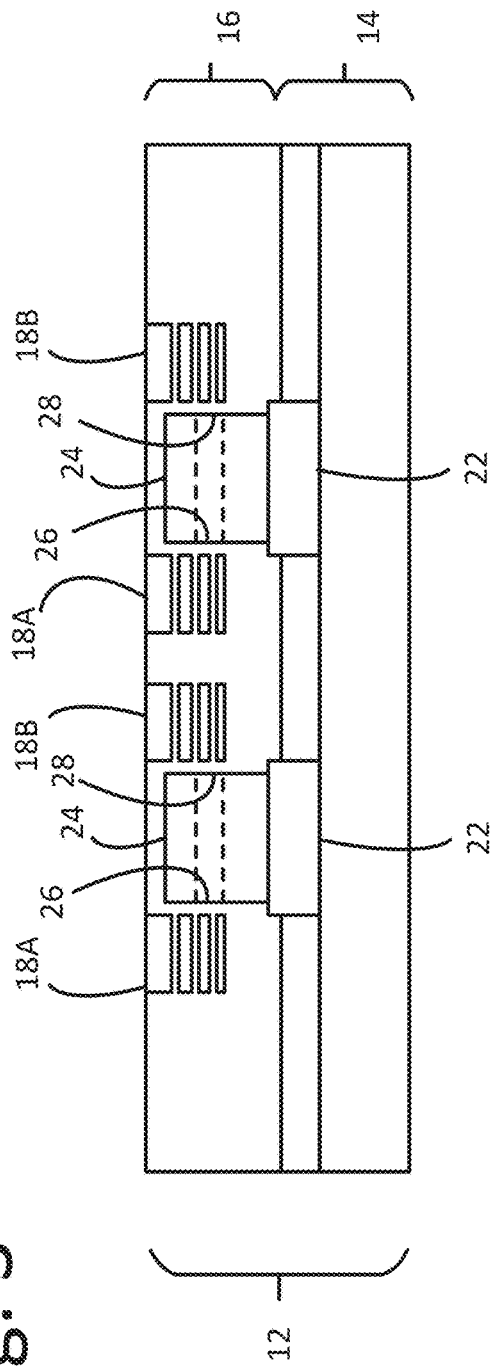

Optical switches with fully-integrated semiconductor switching elements (e.g., integrated optical gates, integrated optical switches) can provide advantages in optical communications within supercomputers, networks etc. Integrated optical switches can provide efficiency improvements to power and speed when electrical to optical conversion is not needed for signal switching and routing to occur. Additionally, integrated optical switches can enable network topologies that utilize efficient optical switches with a high number of connections.

Integrated optical switches as described herein may include semiconductor elements placed, or positioned, onto a wafer and optical coupling elements for high coupling efficiency of light. Additionally, integrated optical switches may also include one or more integrated circuits to facilitate control of the integrated optical switches and enable high frequency performance.

Embodiments as described in this disclosure include the terms "placing" and "direct bonding." It is to be understood as used herein "placing" means mechanically moving and positioning an item to a place or location. For example, placing a semiconductor optical amplifier in a cavity may include mechanically moving the semiconductor optical amplifier to a cavity and also positioning the semiconductor optical amplifier within the cavity. Two examples of "placing" an item such as, e.g., a semiconductor optical amplifier, may be "pick and placing" and "transfer printing" as will be further described herein.

It is to be understood as used herein "direct bonding" is a wafer bonding process where a first layer or object is bonded to a second layer or object without adhesive or any intermediate layers between the first and second layers or objects. For example, a semiconductor optical amplifier may be bonded to a surface of a substrate. When a semiconductor optical amplifier is placed on a surface (e.g., on or in the substrate), a surface of the semiconductor optical amplifier may be bonded to the surface of the substrate without the aid of adhesive. Thereby, a direct bond may be formed.

FIGS. 1-7 illustrate schematic diagrams of examples of an integrated optical switch 10 throughout an integrated optical switch build process or method. As shown in FIG. 1, the build process or method may include providing a base layer 14. As described herein, the partially completed product as shown in each of FIGS. 1-6 may be referred to as a substrate 12. Thus, the base layer 14 may be referred to as the substrate in FIG. 1. As layers and/or devices are added to the base layer 14, such additional layers and/or devices with the base layer 14 may be referred to as the substrate 12. The base layer 14 may be provided using any suitable methods or techniques, e.g., deposition processes, growing processes, or other techniques for forming composite materials. The base layer 14 may include (e.g., be formed of) one or more materials such as, e.g., aluminum-titanium carbide, silicon, gallium arsenide, indium phosphide, aluminum nitride, sapphire, diamond, silicon carbide, silicon nitride, silicon oxynitride, etc. In at least one embodiment, the base layer 14 is silicon oxynitride. Further, the base layer 14 may take on, or define, any suitable size or shape. For example, the base layer 14 may define, or have, a depth, or thickness, (e.g., extending between the two major planar surfaces, or taken perpendicular to the major surfaces) of about 200 micrometers to about 1000 micrometers. In at least one embodiment, the depth, or thickness, of the base layer 14 is 775 micrometers.

At FIG. 2, the example build process may further include providing a device layer 16 on the base layer 14 resulting in a more complete substrate 12. The device layer 16 may be provided, or formed, using any suitable methods or techniques, e.g., deposition, growing, or printing processes. In some embodiments, the device layer 16 may be grown, or deposited, on the base layer 14. The device layer 16 may include, e.g., aluminum-titanium carbide, silicon, gallium arsenide, indium phosphide, aluminium nitride, sapphire, diamond, silicon carbide, silicon nitride, silicon oxynitride, etc. In at least one embodiment, the device layer 16 is silicon nitride. Further, the device layer 16 may take on, or define, any suitable size or shape. For example, the device layer 16 may define, or have, a depth, or thickness, (e.g., extending between the two major planar surfaces, or taken perpendicular to the major surfaces) of about 2 micrometers to about 15 micrometers. In at least one embodiment, the depth, or thickness, of the device layer 16 is 7 micrometers.

Device layer 16 may further include an insulating layer 17. Insulating layer 17 may abut the base layer 14. Insulating layer 17 may include, e.g., silicon oxide, silicon oxynitride, silicon nitride, aluminum oxide, or any other material with suitable insulating properties and refractive index. Further, the insulating layer may take on or define, any suitable size or shape. For example, the insulating layer 17 may have a depth, or thickness, (e.g., extending between the two major planar surfaces or taken perpendicular to the major surfaces) of about 100 nanometers to about 1900 nanometers. In at least one embodiment, the depth of the insulating layer is 900 nanometers.

At FIG. 2, the exemplary build process or method may further include providing input optical couplers 18A, output optical couplers 18B, cavities 20, and heatsinks 22. The input optical couplers 18A and the output optical couplers 18B (referred to collectively as the input and output optical couplers 18) may be formed in the device layer 16. The input and output optical couplers 18 may be formed using any suitable methods or techniques, e.g., chemical vapour deposition (CVD), plasma enhanced chemical vapour deposition (PECVD), atomic layer deposition (ALD), or other deposition or growing processes. The input and output optical couplers 18 may include any suitable structure (e.g., silicon-based structures) for guiding optical signals, e.g., waveguides, optical splitters, optical gratings, evanescent structures, etc. Further, the input and output optical couplers 18 may include or be formed of silicon and one or more materials such as, e.g., oxide and/or nitride materials (e.g., SiN, SiO, SiON, etc.).

The input and output optical couplers 18 may be configured, or designed, to optically couple optical signals from outside of the device layer 16 into the device layer 16, and conversely, from inside the device layer 16 to outside of the device layer 16. As described further herein, each of the input and output optical couplers 18 may optically couple optical waveguides, described further herein with respect to FIG. 4, positioned outside of the device layer 16 to semiconductor optical amplifiers, described further herein with respect to FIG. 4, located within the device layer 16. In other words, the input and output optical couplers 18 may include any suitable structure (e.g., silicon-based structures) to receive and guide optical signals in the device layer 16. The input and output optical couplers 18 may receive and guide optical signals to semiconductor optical amplifiers and receive and guide optical signals output by the semiconductor optical amplifiers.

The exemplary build process or method may further include defining, or forming, one or more cavities 20 in the device layer 16. The cavities 20 may be defined using any suitable method or technique such as, e.g., mechanical drilling, laser drilling, etching, etc. The cavities 20 may extend at least partially into the device layer 16.

The cavities 20 may extend to a surface of a component in the device layer 16. As shown in this example, the cavities may extend to a surface of a heatsink 22 as described further herein. In another embodiment, the cavities 20 may extend to a layer adjacent to the device layer 16 such as, e.g., the base layer 14. The cavities 20 may be defined in-between, or located between, an input and an output optical coupler of input and output optical couplers 18. In other words, the cavities 20 may be described as being "sandwiched" between the input and output optical couplers 18. The input and output optical couplers 18 may direct optical signals into and out of the cavities 20. The input and output optical couplers 18 may extend to a face, or sidewall surfaces, 21 of the cavities 20. The cavities 20 may provide a space, or void, for devices to placed therein such as, e.g., the semiconductor optical amplifiers 24 of FIG. 3. In particular, the cavities 20 may be described as providing a location and arrangement such that devices placed therein can be coupled to the heatsinks 22 for heat dissipation and optically coupled to the input and output optical couplers 18.

The exemplary process or method may further include providing the heatsinks 22 in the base layer 14. The heatsinks 22 may be provided using any suitable method or technique, e.g., electrodeposition, sputtering, electrochemical deposition, or other deposition, growing, or placing processes. The heatsinks 22 may include (e.g., be formed of) include materials such as, e.g., copper, silver, gold, gold-tin, nickel-iron, cobalt-iron, or other heat conducting material. Further, the heatsinks 22 may take on, or define, any suitable size or shape. For example, the heatsinks 22 may have a depth, or thickness, (e.g., extending between the two major planar surfaces or taken perpendicular to the major surfaces) of about 200 nanometers to about 2000 nanometers. In at least one embodiment, the depth of the heatsinks 22 is 1000 nanometers. For example, the heatsinks 22 may provide cooling for adjacent devices (e.g., devices placed in contact therein), e.g., the semiconductor optical amplifiers 24 of FIG. 3. The heatsinks 22 may define a surface to be positioned adjacent and/or in contact a semiconductor optical amplifier.

At FIG. 3, the exemplary process or method may further include providing and placing semiconductor optical amplifiers 24. The semiconductor optical amplifiers 24 may be provided using any suitable methods or techniques such as, e.g., metal-organic chemical vapour deposition (MOCVD), molecular beam epitaxy (MBE), liquid phase epitaxy (LPE) or other epitaxial growth techniques. The semiconductor optical amplifiers 24 may include or be formed of any III-V compound semiconductors such as, e.g., gallium arsenide, indium phosphate, gallium phosphate, gallium nitride, indium gallium arsenide, etc. In other words, the semiconductor optical amplifiers 24 may be, or be referred to as, III-V compound semiconductor optical amplifiers. Each of the semiconductor optical amplifiers 24 may include an optical amplifier input 26 to receive an optical signal and an optical amplifier output 28 to selectively output the received optical signal. It may be described semiconductor optical amplifiers 24 may extend from an input end region to an output region where the input end region includes the optical amplifier input 26 and the output end region includes the optical amplifier output 26.

Each of the optical amplifiers 24 may be placed in one of the cavities 20. Placing the semiconductor optical amplifiers 24 in the cavities 20 may optically couple the semiconductor optical amplifiers 24 to the input and output optical couplers 18. The semiconductor optical amplifiers 24 may be positioned such that inputs 26 and outputs 28 are positioned adjacent to input and output optical couplers 18. Inputs 26 may receive optical signals from input optical couplers 18A. Outputs 28 may output optical signals to output optical couplers 18B. Additionally, placing the semiconductor optical amplifiers 24 in the cavities 20 may couple the semiconductor optical amplifiers 24 to the heatsinks 22. For example, the semiconductor optical amplifiers 24 may be thermally coupled to the heatsinks 22 for heat dissipation.

Furthermore, mechanically placing the semiconductor optical amplifiers 24, on or in a substrate as described herein, may result in a gap, or space, of less than or equal to 500 nanometers, less than or equal to about 300 nanometers, and/or less than or equal to 100 nanometers between the semiconductor optical amplifier 24 and silicon components (e.g., between inputs 26 and input optical couplers 18A and between outputs 28 and output optical couplers 18B). In other words, the methods described herein may include positioning a III-V compound semiconductor optical amplifier 24 proximate silicon components such that the gap therebetween may be less than or equal to 500 nanometers. Gaps of less than or equal to 500 nanometers may also increase performance such as, e.g., lower power consumption and faster response times than methods and apparatus that result in gaps greater than 500 nanometers. In general, other methods of making and apparatus using semiconductor optical amplifiers (such as III-V semiconductor optical amplifiers) integrated with silicon substrates and/or optical couplers/inputs/outputs formed of silicon may result in gaps larger than 500 nanometers between them (e.g., greater than 1 micrometer). For example, semiconductor optical amplifiers may be grown in situ with silicon substrates and other silicon structures (e.g., silicon-based structures), and such processes may result in gaps larger than 500 nanometers between them (e.g., greater than 1 micrometer).

The semiconductor optical amplifiers 24 may be placed in the cavities using any suitable processes or methods. In some embodiments, placing the semiconductor optical amplifiers 24 in the cavities may include placing the semiconductor optical amplifiers 24 in the cavities using a "pick and place" apparatus. For example, the semiconductor optical amplifiers 24 may be provided (e.g., grown or deposited, fabricated, etc.) on a surface (e.g., a wafer) different from the base and device layers 14, 16, the "pick and place" apparatus may "pick up" or "grab" the semiconductor optical amplifiers 24 from the surface, move and position the semiconductor optical amplifiers 24 to be placed in the cavities 20, and then move the semiconductor optical amplifiers 24 into the cavities 20 to be coupled therein.

In other embodiments, placing the semiconductor optical amplifiers 24 in the cavities 20 may include transfer printing the semiconductor optical amplifiers 24 into the cavities 20. Transfer printing the semiconductor optical amplifiers 24 may include providing the semiconductor optical amplifiers 24 on a wafer and transferring the semiconductor optical amplifiers 24 from the wafer to the cavities 20. The semiconductor optical amplifiers 24 may be attached to a substrate of the wafer by a release layer. Before transferring the semiconductor optical amplifiers 24 to the cavities 20, the release layer may be removed. The release layer may be removed using any suitable methods or techniques such as, e.g., etching, erosion, etc. After removing the release layer, the semiconductor optical amplifiers 24 may be picked-up from the wafer. The semiconductor optical amplifiers 24 may then be moved into cavities 20. In some embodiments, the semiconductor optical amplifiers 24 may be transferred to the cavities 20 using a stamp. Stamps may include, e.g., a polydimethylsiloxane stamp. The semiconductor optical amplifiers 24 may be "picked up" by the stamp, moved into the cavities 20, and released from the stamp leaving the semiconductor optical amplifiers 24 in the cavities 20.

Placing the semiconductor optical amplifiers 24 may include direct bonding each of the semiconductor optical amplifiers 24 in the cavities 20. In some embodiments, a surface of the semiconductor optical amplifiers 24 may be bonded to a surface of the substrate 12 within the cavities 20. In some embodiments, the semiconductor optical amplifiers 24 may each be direct bonded to the heatsinks 22. Direct bonding may result in a bond formed between the semiconductor optical amplifier and the substrate 12 or the heatsinks 22 without the aid of adhesives or additional layers.

In some embodiments, placing the semiconductor optical amplifiers 24 may include adhering the semiconductor optical amplifiers 24 in the cavities 20 using adhesive. The adhesive may include any suitable materials such as, e.g., benzocyclobutene (BCB) or any other adhesive polymer. Adhesive may be placed on a surface of the semiconductor optical amplifiers 24, a surface of the substrate 12 within the cavities 20, or a surface of the heatsinks 22 prior. After the adhesive has been applied, the semiconductor optical amplifiers 24 may be placed into the cavities 20. The adhesive may bond the semiconductor optical amplifiers 24 to the substrate 12 and/or the heatsinks 22.

Figure 4:
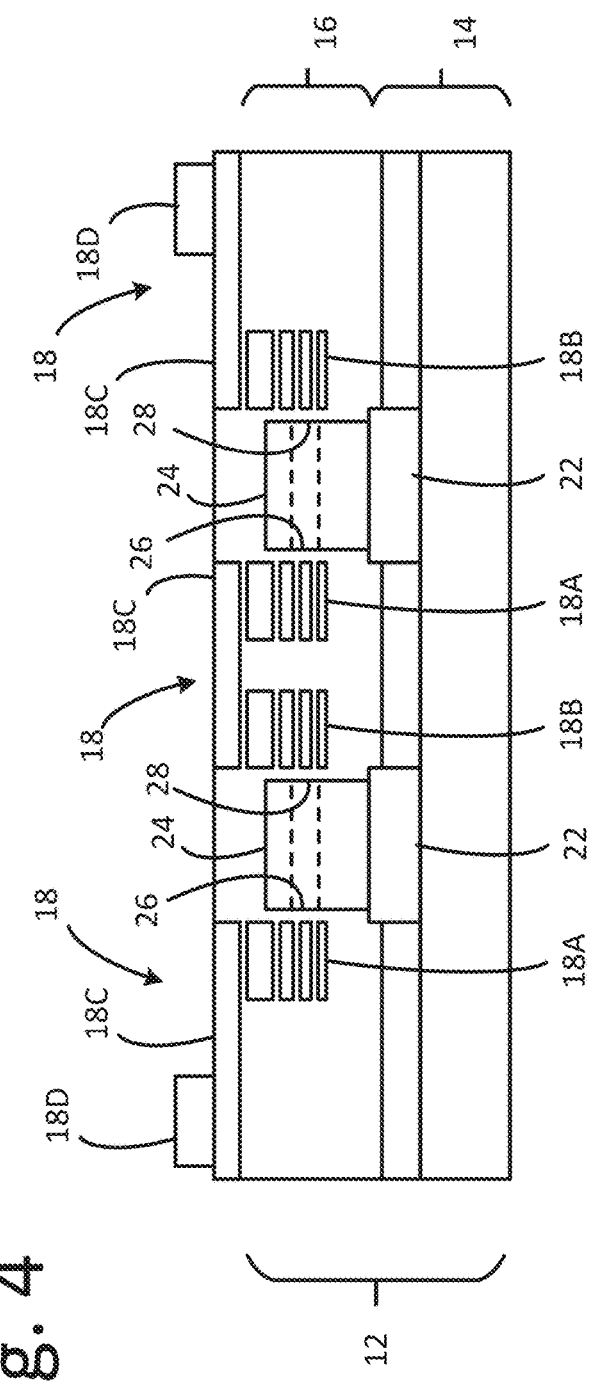

At FIG. 4, the exemplary build process or method may further include providing waveguides 18C and couplers 18D. Input and output couplers 18 may be formed to include couplers 18D and waveguides 18C. Forming input and output couplers 18 may include depositing and patterning waveguides (e.g., waveguides 18C), couplers (e.g., couplers 18D), and/or splitters. Input couplers and output couplers 18 may transport received optical signals to the semiconductor optical amplifiers 24 and optical signals output from the semiconductor optical amplifiers 24. For example, an optical signal may be received at one of the couplers 18D. The received signal may be guided by one of the waveguides 18C to one of the semiconductor optical amplifiers 24. The optical signal may be output by the semiconductor optical amplifier 24 that received the optical signal. The output optical signal may be guided by a second waveguide of the waveguides 18C to a second semiconductor optical amplifier of the semiconductor optical amplifiers 24 or to a second coupler of the couplers 18.

Figure 5:
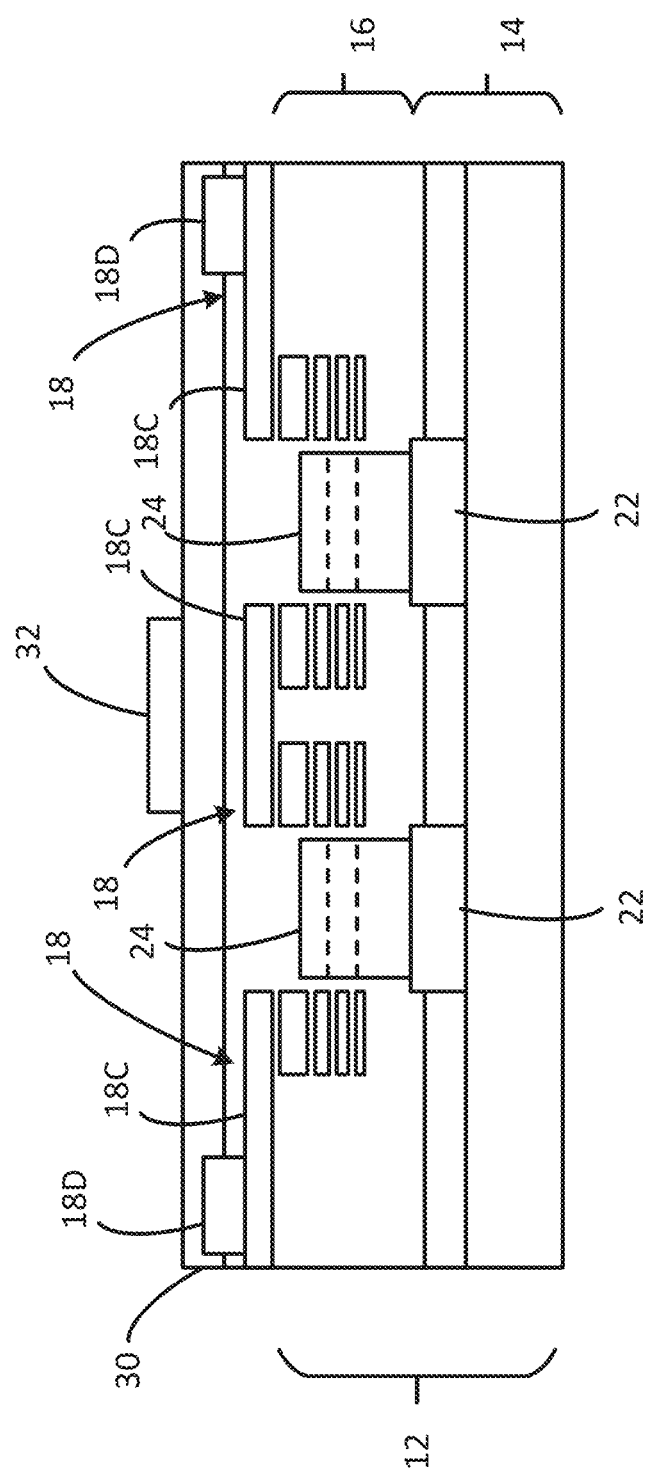

At FIG. 5, the exemplary process or method may further include providing an insulator layer 30 and a computing apparatus 32. The insulator layer 30 may be provided on the device layer 16. The insulator layer 30, may include materials such as, e.g., silicon oxide, silicon dioxide, silicon oxynitride, silicon nitride, aluminum oxide, or any other material with suitable insulating properties and refractive index. The insulator layer 30 may take, or define, on any suitable size or shape. For example, the insulator layer may have a depth, or thickness, (e.g., extending between the two major planar surfaces or taken perpendicular to the major surfaces) of about 5 micrometers to about 100 micrometers. In at least one embodiment, the depth of the insulator layer 30 is 70 micrometers.

The computing apparatus 32 may include at least one or more processors, controllers, memory, amplifier, etc. The computing apparatus 32 may be provided on the insulator layer 30. The computing apparatus 32 may be operatively coupled (e.g., wirelessly coupled, electrically coupled, optically coupled, etc.) to the semiconductor optical amplifiers 24. The computing apparatus 32 may control gating of the semiconductor optical amplifiers 24. By controlling gating of the semiconductor optical amplifiers 24, computing apparatus 32 may control the routing and selective output of optical signals within the integrated optical switch 10.

Figure 6:
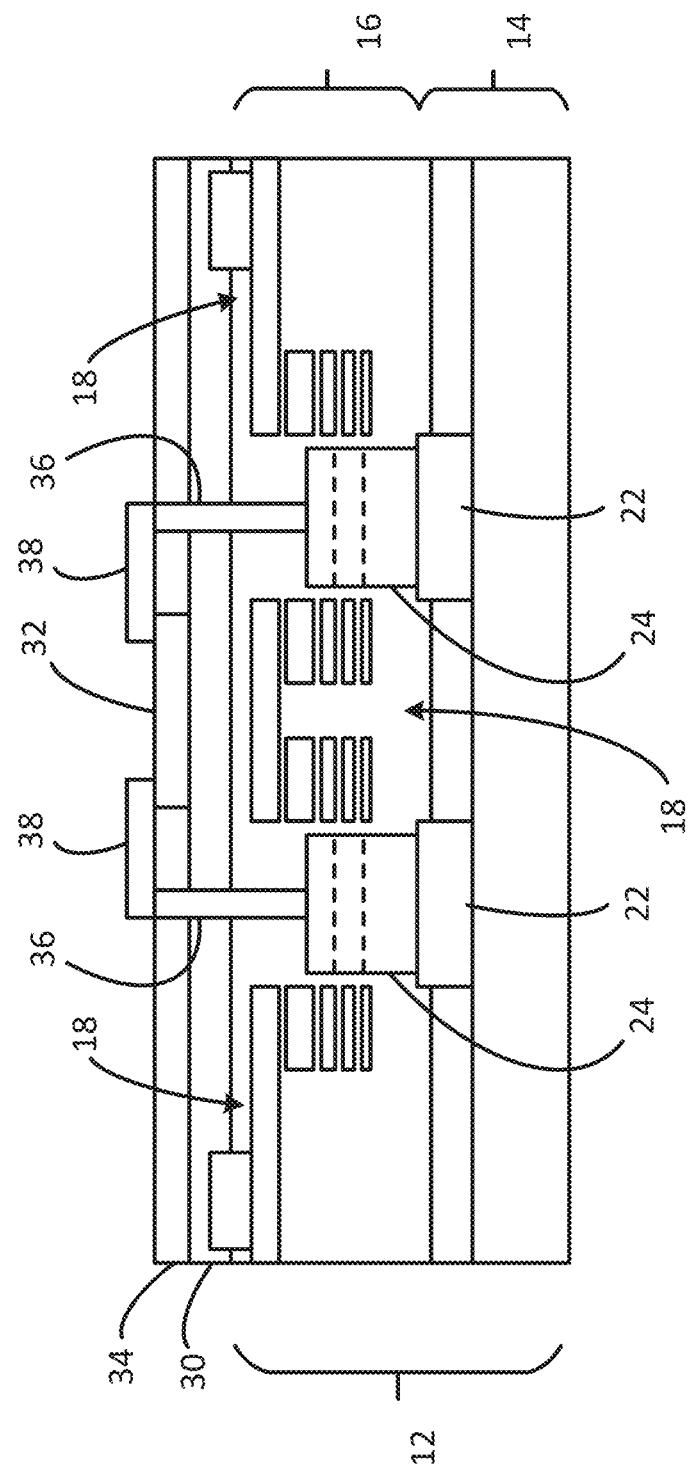

At FIG. 6, the exemplary process or method may further include providing cladding 34, conductors 36, and contacts 38. The cladding 34 may be provided on the insulator layer 30. The cladding 34 may reflect optical signals to keep optical signals within the input and output optical couplers 18. The cladding 34 may have a lower index of refraction than the input and output optical couplers 18. The cladding 34 may include materials such as, e.g., polyethylene, silicon oxynitride, silicon oxide, aluminum oxide, or other materials with suitable refractive index.

The conductors 36 may be provided in vias. The vias may be formed through various layers, e.g., the cladding 34, the insulator layer 30, and the device layer 16. The vias may extend from the cladding 34 to the semiconductor optical amplifiers 24. The conductors 36 may at least partially fill in the vias. The conductors may include one or more of materials such as, e.g., copper, gold, silver, aluminum, or other electrically conductive materials.

The contacts 38 may be formed on or in the cladding 34. The contacts 38 may extend over a portion of the computing apparatus 32. The contacts may electrically couple the computing apparatus 32 to the conductors 36. In other words, the computing apparatus 32 may be electrically coupled to the semiconductor optical amplifiers 24 by conductors 36 and contacts 38. The contacts 38 may include one or more materials such as, e.g., copper, gold, silver, aluminum, or other electrically conductive materials.

Figure 7:
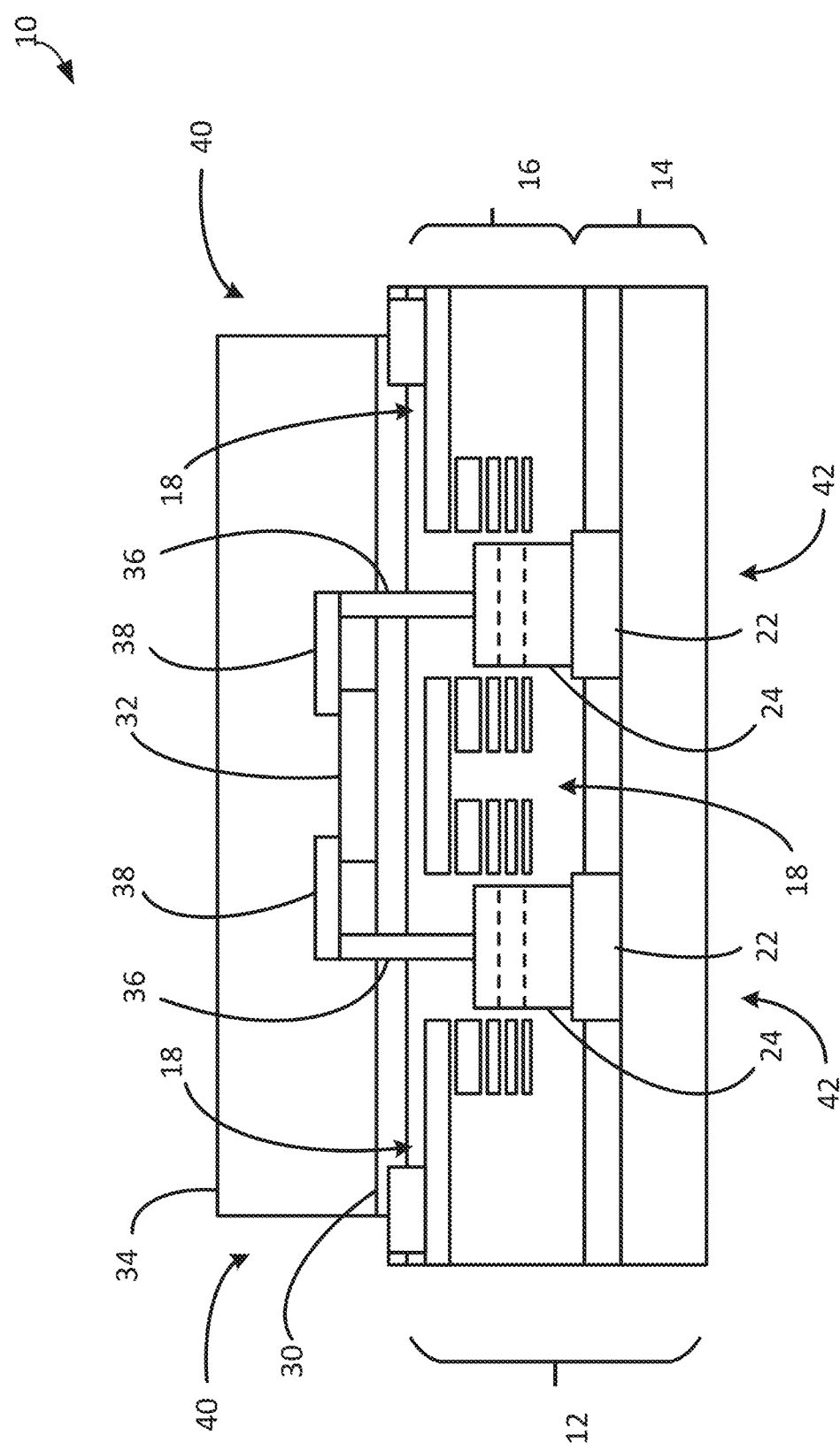

At FIG. 7, the exemplary method or process may further include providing the cladding 34 over contacts 38 and v-grooves 40. Additional cladding may be provided to the cladding 44 as shown in FIG. 6. The cladding 34 may extend over at least a portion of the contacts 38 and the computing apparatus 32. The v-grooves 40 may be formed in the cladding 34. The v-grooves 40 may be configured to, or formed to, receive and hold connection optical fibers for input and output optical signals to/from the connection optical fibers to the input and output optical couplers 18. The v-grooves 40 may be formed using any suitable method or process, e.g., drilling, laser etching, etc. The v-grooves 40 may have a width of about 100 micrometers to about 150 micrometers. In at least one embodiment, the width of the v-grooves is 145 micrometers. Further, the v-grooves 40 may have a depth of about 50 micrometers to about 100 micrometers. In at least one embodiment, the depth of the v-grooves is 75 micrometers.

The result of the build process as shown in FIGS. 1-7 is a pair of optical gates 42 that can provide an illustrative integrated optical switch 10. An integrated optical switch 10 may include one or more of optical gates 42. An optical gate 42 may be described as including a substrate (e.g., the substrate 12) that may include a base layer (e.g., base layer 14) and a device layer (e.g., device layer 16), input and output optical couplers (e.g., input and output optical couplers 18), and a semiconductor optical amplifier (e.g., the semiconductor optical amplifiers 24). Optical gate 42 may further include a computing apparatus such as computing apparatus 32. An integrated optical switch 10 may include optical gates (e.g., optical gate 42) arranged to allow a number of optical inputs to be provided to any of a number of optical outputs.

Figure 8:
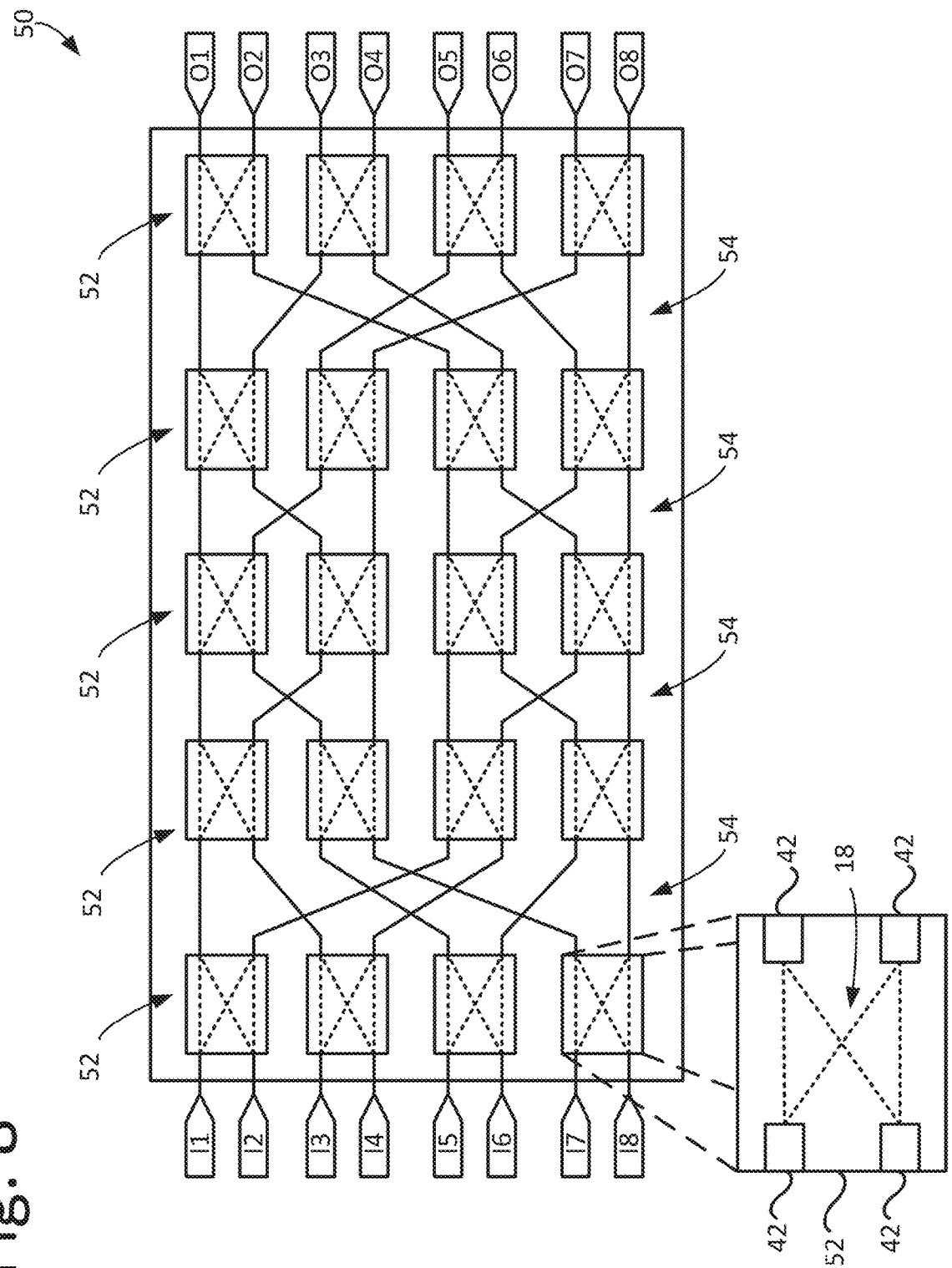
FIG. 8 is a schematic diagram of one example of an integrated optical switch.

In other words, optical gates 42 can be used to form, or provide, an integrated optical switch 10 to provide an integrated optical switch capable of receiving multiple optical signals and selectively outputting the received optical signals at any output of the integrated optical switch 10. For example, integrated optical switch 10 may include a plurality of inputs to receive optical signals, a plurality of outputs to output the optical signals, and a plurality of semiconductor optical amplifiers to act as gates for the optical signals between the plurality of inputs and the plurality of outputs. The plurality of inputs and outputs may be positioned on the substrate 12. Further the plurality of semiconductor optical outputs may be mechanically placed in the substrate to optically couple the plurality of inputs and the plurality of outputs to provide a switch arranged between the plurality of and the plurality of outputs. In other words, the plurality of semiconductor optical amplifiers may be operable to act as gates for the optical signals between the plurality of inputs and the plurality of outputs. FIG. 8 depicts a schematic diagram 50 (e.g., plan or overhead view) of one example arrangement of an integrated optical switch (e.g., integrated optical switch 10). The schematic diagram 50 includes inputs I1-I8, outputs O1-O8, 2×2 gate blocks 52, and optical connections 54.

The inputs I1-I8 and the outputs O1-O8 may be provided by an optical medium, e.g., fiber optic cables. The inputs I1-I8 may be connected to the integrated optical switch by input couplers (e.g., the input couplers 18). The inputs I1-I8 may provide optical signals to the integrated optical switch. Signals received from the inputs I1-I8 may be output at any of the outputs O1-O8. The outputs O1-O8 may be connected to the integrated optical switch by output couplers (e.g., the output couplers 18). The outputs O1-O8 may receive optical signals selectively output by the integrated optical switch.

Each of the 2×2 gate blocks 52 may provide routing and selective outputting of optical signals received by the integrated optical switch. Each of the 2×2 gate blocks 52 may include four optical gates 42. Each of the 2×2 gate blocks 52 includes two inputs and two outputs. The 2×2 optical gates are optically coupled by optical connections 54. The optical connections 54 may include input and output optical couplers (e.g., the input and output optical couplers 18). By selectively opening and closing the optical gates of the 2×2 gate blocks 52, the optical signals received at the inputs I1-I8 can be routed and selectively output to any of outputs O1-O8.

The methods and/or logic described in this disclosure, including those attributed to the integrated optical switch 10, or various constituent components (e.g., the computing apparatus 32), may be implemented, at least in part, in hardware, software, firmware, or any combination thereof. For example, various aspects of the techniques may be implemented within one or more processors, including one or more microprocessors, microcontrollers, DSPs, ASICs, FPGAs, or any other equivalent integrated or discrete logic circuitry, as well as any combinations of such components, or other devices. The term "processor" or "processing circuitry" may generally refer to any of the foregoing logic circuitry, alone or in combination with other logic circuitry, or any other equivalent circuitry. Such hardware, software, and/or firmware may be implemented within the same system or within separate systems to support the various operations and functions described in this disclosure. In addition, any of the described components may be implemented together or separately as discrete but interoperable logic devices.

When implemented in software, the functionality ascribed to the systems, devices and methods described in this disclosure may be embodied as instructions and/or logic on a computer-readable medium such as RAM, ROM, NVRAM, EEPROM, FLASH memory, magnetic data storage media, optical data storage media, or the like. The instructions and/or logic may be executed by one or more processors to support one or more aspects of the functionality described in this disclosure.

Therefore, as described herein, the semiconductor optical amplifiers 24 may be integrated within the integrated optical switch 10 (e.g., using a transfer printing process). As such, the semiconductor optical amplifiers 24 as described herein may not be coupled to the integrated optical switch 10 upon fabrication of the remainder of the integrated optical switch 10, e.g., such that a semiconductor optical amplifier is in a separate package that is attached to an external surface of the integrated optical switch 10 and not grown in situ. Semiconductor optical amplifiers 24 may be grown using III-V semiconductor deposition techniques that may not be compatible with silicon deposition techniques of the device layer 16 and the included waveguides and couplers 18. Thus, the semiconductor optical amplifiers 24 may be grown separately from the silicon substrates 12 and structures (e.g., silicon-based structures) therein. Then, using the methods described herein (e.g., mechanical placement such as pick-and-place, transfer printing, etc.), semiconductor optical amplifiers 24 grown using III-V semiconductor deposition techniques may be integrated with silicon substrates 12 resulting in a gap between the semiconductor optical amplifiers 24 and the couplers 18 of device layer 16 such as, e.g., less than 500 nanometers to about 100 nanometers. Gaps of less than or equal to 500 nanometers, less than or equal to 300 nanometers, and/or less than or equal to 100 nanometers may allow for less power to be used and faster response times than methods and apparatus that result in larger gaps.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above, "below", etc. may be used in this disclosure. These terms should not be construed as limiting the position or orientation of a structure, but should be used as providing spatial relationship between the structures.

Embodiments of waveguides and methods of making waveguides are disclosed. The implementations described above, and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. An apparatus comprising:
 a substrate comprising silicon;
 a plurality of inputs to receive optical signals, the plurality of inputs positioned on the substrate;
 a plurality of outputs to output the optical signals, the plurality of outputs positioned on the substrate; and
 a plurality of III-V compound semiconductor optical amplifiers mechanically placed in cavities in the substrate to optically couple the plurality of inputs and the plurality of outputs to provide a switch arranged between the plurality of inputs and the plurality of outputs, the plurality of semiconductor optical amplifiers operable to act as gates for the optical signals between the plurality of inputs and the plurality of outputs,
  wherein the plurality of III-V compound semiconductor optical amplifiers are integrated within the cavities in the substrate defining a gap between each of the plurality of III-V compound semiconductor optical amplifiers and other silicon-based structures of the substrate that is less than or equal to 500 nanometers.

2. The apparatus of claim 1, further comprising a computing apparatus comprising one or more processors and operably coupled to the plurality of semiconductor optical amplifiers to control gating of the optical signals via the plurality of semiconductor optical amplifiers.

3. The apparatus of claim 1, wherein each of the plurality of semiconductor optical amplifiers is direct bonded in the substrate.

4. The apparatus of claim 1, further comprising adhesive adhering each of the plurality of semiconductor optical amplifiers in the substrate.

5. The apparatus of claim 1, further comprising a plurality of heatsinks, each heatsink of the plurality of heatsinks positioned adjacent to a semiconductor optical amplifier of the plurality of semiconductor optical amplifiers.

6. An optical gate comprising:
 a substrate comprising:
  a base layer, and
  a device layer on the base layer;
 input and output optical couplers comprising silicon and formed in the device layer, the optical couplers to transmit light into and out of the device layer; and
 a III-V semiconductor material semiconductor optical amplifier mechanically placed in a cavity of the device layer, the semiconductor optical amplifier comprising:
  an optical amplifier input optically coupled to the input optical coupler to receive an optical signal, and
  an optical amplifier output optically coupled to the output optical coupler to selectively output the received optical signal,
  wherein the III-V semiconductor material semiconductor optical amplifier is integrated within the cavity of the device layer defining a first gap of less than or equal to 500 nanometers between the semiconductor optical amplifier input and the input optical coupler and a second gap of less than or equal to 500 nanometers between the semiconductor optical amplifier output and the output optical coupler.

7. The gate of claim 6, further comprising a computing apparatus positioned outside of the device layer and comprising one or more processors and operably coupled to the semiconductor optical amplifier to control gating of the optical signal via the semiconductor optical amplifier.

8. The gate of claim 6, wherein the semiconductor optical amplifier is direct bonded in the substrate.

9. The gate of claim 6, further comprising adhesive adhering the semiconductor optical amplifier in the substrate.

10. The gate of claim 6, further comprising a heatsink positioned adjacent to the semiconductor optical amplifier.

11. A method comprising:
providing a substrate comprising:
a base layer, and
a device layer on the base layer;
forming input and output optical couplers in the device layer, the optical couplers to transmit light into and out of the device layer;
defining a cavity in the device layer;
providing a semiconductor optical amplifier comprising:
an optical amplifier input to receive an optical signal, and
an optical amplifier output to selectively output the received optical signal; and
mechanically placing the semiconductor optical amplifier in the cavity optically coupling the optical amplifier input to the input optical coupler and the optical amplifier output to the output optical coupler,
wherein the semiconductor optical amplifier is integrated within the cavity in the device layer defining a first gap of less than or equal to 500 nanometers between the optical amplifier input and the input optical coupler and a second gap of less than or equal to 500 nanometers between the optical amplifier output and the output optical coupler.

12. The method of claim 11, wherein placing the semiconductor optical amplifier in the cavity comprises direct bonding the semiconductor optical amplifier in the cavity.

13. The method of claim 11, wherein placing the semiconductor optical amplifier in the cavity comprises adhering the semiconductor optical amplifier using adhesive in the cavity.

14. The method of claim 11, wherein placing the semiconductor optical amplifier in the cavity comprises transfer printing the semiconductor optical amplifier into the cavity.

15. The method of claim 11, wherein placing the semiconductor optical amplifier in the cavity comprises placing the semiconductor optical amplifier in the cavity using a pick and place apparatus.

16. The method of claim 11, wherein forming the input and output couplers comprises forming waveguides to guide the optical signal.

17. The method of claim 11, further comprising:
providing an insulator layer on the device layer;
providing a computing apparatus comprising at least one processor on the insulator layer; and
operatively coupling the computing apparatus to the semiconductor optical amplifier.

18. The method of claim 17, wherein operatively coupling the computing apparatus to the semiconductor optical amplifier comprises:
forming a via from a surface of the insulator layer to a surface of the semiconductor optical amplifier;
providing a conductor in the via; and
forming a contact to electrically couple the computing apparatus and the conductor in the via.

19. The method of claim 11, further comprising providing a heatsink in the base layer adjacent to the semiconductor optical amplifier.

* * * * *